(12) United States Patent
Amick et al.

(10) Patent No.: US 9,374,080 B2
(45) Date of Patent: Jun. 21, 2016

(54) METHOD AND APPARATUS FOR POWER-UP DETECTION FOR AN ELECTRICAL MONITORING CIRCUIT

(71) Applicant: ADVANCED MICRO DEVICES, INC., Sunnyvale, CA (US)

(72) Inventors: Brian W. Amick, Bedford, MA (US); Gerald R. Talbot, Concord, MA (US); Warren Anderson, Westborough, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/518,591

(22) Filed: Oct. 20, 2014

(65) Prior Publication Data

US 2015/0130519 A1 May 14, 2015

Related U.S. Application Data

(60) Provisional application No. 61/904,307, filed on Nov. 14, 2013.

(51) Int. Cl.
*H03K 17/22* (2006.01)
(52) U.S. Cl.
CPC ..................... *H03K 17/22* (2013.01)

(58) Field of Classification Search
None
See application file for complete search history.

(56) References Cited

U.S. PATENT DOCUMENTS

| 7,881,144 | B1 * | 2/2011 | Maung | G11C 5/147 327/142 |
|---|---|---|---|---|
| 2009/0219066 | A1 * | 9/2009 | Shkidt | H03K 17/22 327/143 |
| 2011/0062996 | A1 * | 3/2011 | Chang | H03K 17/223 327/77 |

* cited by examiner

*Primary Examiner* — Long Nguyen
(74) *Attorney, Agent, or Firm* — Faegre Baker Daniels LLP

(57) ABSTRACT

A method and apparatus is provided for outputting a reset signal during power-up until two conditions are satisfied. In one embodiment, the method and apparatus includes a voltage detector that provides a first output ("VO1") when an output voltage of a regulator ("VREG") exceeds a threshold voltage, thereby satisfying a first condition, a comparator receiving a first input voltage and a second input voltage, the comparator providing a second output ("VO2") when the first input voltage exceeds the second input voltage, thereby satisfying a second condition, and a release circuit that outputs the reset signal unless the voltage detector provides VO1 while the comparator provides VO2.

19 Claims, 12 Drawing Sheets

METHOD AND APPARATUS FOR POWER-UP DETECTION FOR AN ELECTRICAL MONITORING CIRCUIT

CROSS-REFERENCE TO RELATED APPLICATIONS

This application claims priority to and the benefit of U.S. Provisional Application Ser. No. 61/904,307, filed Nov. 14, 2013.

BACKGROUND OF THE DISCLOSURE

The disclosure relates generally to a method and apparatus for power-up detection for an electrical monitoring circuit which, in one application, may be used to prevent unauthorized access to chip contents.

Many complex processors such as those including systems on a chip ("SoC") and used in video game consoles, store digital media content that is copyrighted or other proprietary information that needs to be secure. Such data is typically stored and transmitted in an encrypted format. Unfortunately, hackers sometimes purchase consoles with the goal of identifying the encryption keys used to protect the contents of the chip. With the encryption keys identified, the hacker can decrypt the content and exploit it in a variety of ways.

One method hackers use to gain access to the encryption keys is to change the operating parameters of the chip to place it in an undesirable mode of operation. When in such an undesirable mode, the chip's standard security circuits may be non-functional, thereby permitting access to the encryption keys, and then the proprietary content. For example, if a chip is forced to operate under very high or very low ambient temperatures, the chip may operate in an undesirable mode. Similarly, if any of a variety of voltage inputs to the chip are increased or decreased beyond certain limits, the chip may operate in an undesirable mode. Finally, if the clock input to the chip is modified in period or low time, the chip may operate in an undesirable mode. If the malfunctions resulting from an undesirable operating mode are repeatable, it is possible stored media content or other information can be hacked.

Moreover, processors may be particularly vulnerable to such hacking during transitional modes of operation such as power up and reset. Some processors have a platform security processor ("PSP") or security functional block which is configured to place the processor into a secure operating mode when a hacking attempt is detected, but this is often not sufficient as such a security processor is limited to this secure operating mode and not during such transitional modes.

Accordingly, there exists a need for an improved method and apparatus for maintaining the chip in a reset mode during power-up until it is determined that certain voltages have reached safe levels to thereby prevent unauthorized access to the contents of the chip and address one or more of the above-noted drawbacks.

SUMMARY OF EMBODIMENTS OF THE INVENTION

According to one embodiment of the present disclosure, an apparatus for outputting a reset signal during power-up until two conditions are satisfied, comprises a voltage detector that provides a first output ("VO1") when an output voltage of a regulator ("VREG") exceeds a threshold voltage, thereby satisfying a first condition, a comparator receiving a first input voltage and a second input voltage, the comparator providing a second output ("VO2") when the first input voltage exceeds the second input voltage, thereby satisfying a second condition, and a release circuit that outputs the reset signal unless the voltage detector provides VO1 while the comparator provides VO2. One aspect of this embodiment further comprises a reference circuit that provides a reference voltage ("VREF") as the second input voltage to the comparator, VREF corresponding to a voltage drop of a supply voltage across a diode. In a variant of this aspect, VREG is the first input voltage to the comparator. Another aspect of this embodiment further comprises a reference circuit that provides a first voltage ("VDIV") as the first input voltage to the comparator and a second voltage ("VREF") as the second input voltage to the comparator, VDIV corresponding to an output voltage of a voltage divider having a supply voltage as an input and VREF corresponding to a voltage drop of the supply voltage across a diode. Yet another aspect of this embodiment further comprises a reference circuit that provides a first voltage ("VDIV1") as the first input voltage to the comparator and a second voltage ("VDIV2") as the second input voltage to the comparator, VDIV1 corresponding to an output voltage of a first voltage divider having a supply voltage as an input and VDIV2 corresponding to an output voltage of a second voltage divider having VREG as an input. In still another aspect, the regulator provides VREG as a function of a bandgap generator output ("VBG"). In another aspect, the release circuit is a NAND gate having VO1 as one input and VO2 as another input. In yet another aspect, the voltage detector includes a transistor having a gate connected to VREG and a source connected through an input resistor to a supply voltage, a voltage at the gate of the transistor being the threshold voltage.

According to another embodiment of the present disclosure, a method of determining whether to output a reset signal during power-up to prevent operation of a digital monitoring circuit until two conditions are satisfied, comprises generating a first output ("VO1") when an output voltage of a regulator ("VREG") exceeds a threshold voltage, thereby satisfying a first condition, comparing a first input voltage and a second input voltage, generating a second output ("VO2") when the first input voltage exceeds the second input voltage, thereby satisfying a second condition, outputting the reset signal in the absence of one or both of VO1 and VO2, and not outputting the reset signal when both VO1 and VO2 are generated. One aspect of this embodiment further comprises providing a reference voltage ("VREF") as the second input voltage, VREF corresponding to a voltage drop of a supply voltage across a diode. In a variant of this aspect, VREG is the first input voltage. Another aspect of this embodiment further comprises providing a first voltage ("VDIV") as the first input voltage, and providing a second voltage ("VREF") as the second input voltage, wherein VDIV corresponds to an output voltage of a voltage divider having a supply voltage as an input and VREF corresponds to a voltage drop of the supply voltage across a diode. Still another aspect of this embodiment further comprises providing a first voltage ("VDIV1") as the first input voltage, and providing a second voltage ("VDIV2") as the second input voltage, wherein VDIV1 corresponds to an output voltage of a first voltage divider having a supply voltage as an input and VDIV2 corresponds to an output voltage of a second voltage divider having VREG as an input. Another aspect of this embodiment further comprises generating a VREG as a function of a bandgap generator output ("VBG"). In another aspect, the threshold voltage is a transistor threshold voltage.

In yet another embodiment of the present disclosure, an apparatus for monitoring performance of a processor to detect tampering and place the processor in a safe operating state that prevents unauthorized access to contents of the processor comprises a voltage detector that provides a first output ("VO1") when an output voltage of a regulator ("VREG") exceeds a threshold voltage, a comparator receiving a first input voltage and a second input voltage, the comparator providing a second output ("VO2") when the first input voltage exceeds the second input voltage, a release circuit that outputs the reset signal unless the voltage detector provides VO1 while the comparator provides VO2, and a monitoring circuit connected to the release circuit, the monitoring circuit remaining in a reset mode during power-up until the release circuit stops outputting the reset signal, whereupon the monitoring circuit compares a first measured value of an operating parameter of the processor to a predefined set of high and low limits to identify an out of limits measured value. One aspect of this embodiment further comprises a reference circuit that provides a reference voltage ("VREF") as the second input voltage to the comparator, VREF corresponding to a voltage drop of a supply voltage across a diode. In a variant of this aspect, VREG is the first input voltage to the comparator. Another aspect of this embodiment further comprises a reference circuit that provides a first voltage ("VDIV") as the first input voltage to the comparator and a second voltage ("VREF") as the second input voltage to the comparator, VDIV corresponding to an output voltage of a voltage divider having a supply voltage as an input and VREF corresponding to a voltage drop of the supply voltage across a diode. Yet another aspect of this embodiment further comprises a reference circuit that provides a first voltage ("VDIV1") as the first input voltage to the comparator and a second voltage ("VDIV2") as the second input voltage to the comparator, VDIV1 corresponding to an output voltage of a first voltage divider having a supply voltage as an input and VDIV2 corresponding to an output voltage of a second voltage divider having VREG as an input.

BRIEF DESCRIPTION OF THE DRAWINGS

The embodiments will be more readily understood in view of the following description when accompanied by the below figures and wherein like reference numerals represent like elements, wherein.

DETAILED DESCRIPTION OF EMBODIMENTS

Briefly, in one example, a method and apparatus for outputting a reset signal during power-up until two conditions are satisfied includes a voltage detector that provides a first output ("VO1") when an output voltage of a regulator ("VREG") exceeds a threshold voltage, thereby satisfying a first condition, a comparator receiving a first input voltage and a second input voltage, the comparator providing a second output ("VO2") when the first input voltage exceeds the second input voltage, thereby satisfying a second condition, and a release circuit that outputs the reset signal unless the voltage detector provides VO1 while the comparator provides VO2. In certain embodiments, the first and second input voltages to the comparator correspond to characteristics of a supply voltage and/or characteristics of VREG. Thus, the present disclosure provides a method and apparatus which maintains a reset signal during power-up (which prevents operation of the circuit receiving the reset signal) until the supply voltage and VREG reach safe, normal operating voltages. As such, in applications where the reset signal is applied to a circuit that monitors performance of a processor to detect tampering, the method and apparatus of the present disclosure inhibits tampering with operating parameters of the processor to gain access to copyrighted or otherwise restricted information included within the processor by ensuring that the processor remains in a reset mode where such information is not available during power-up. Other advantages will be recognized by those skilled in the art.

Figure 1:
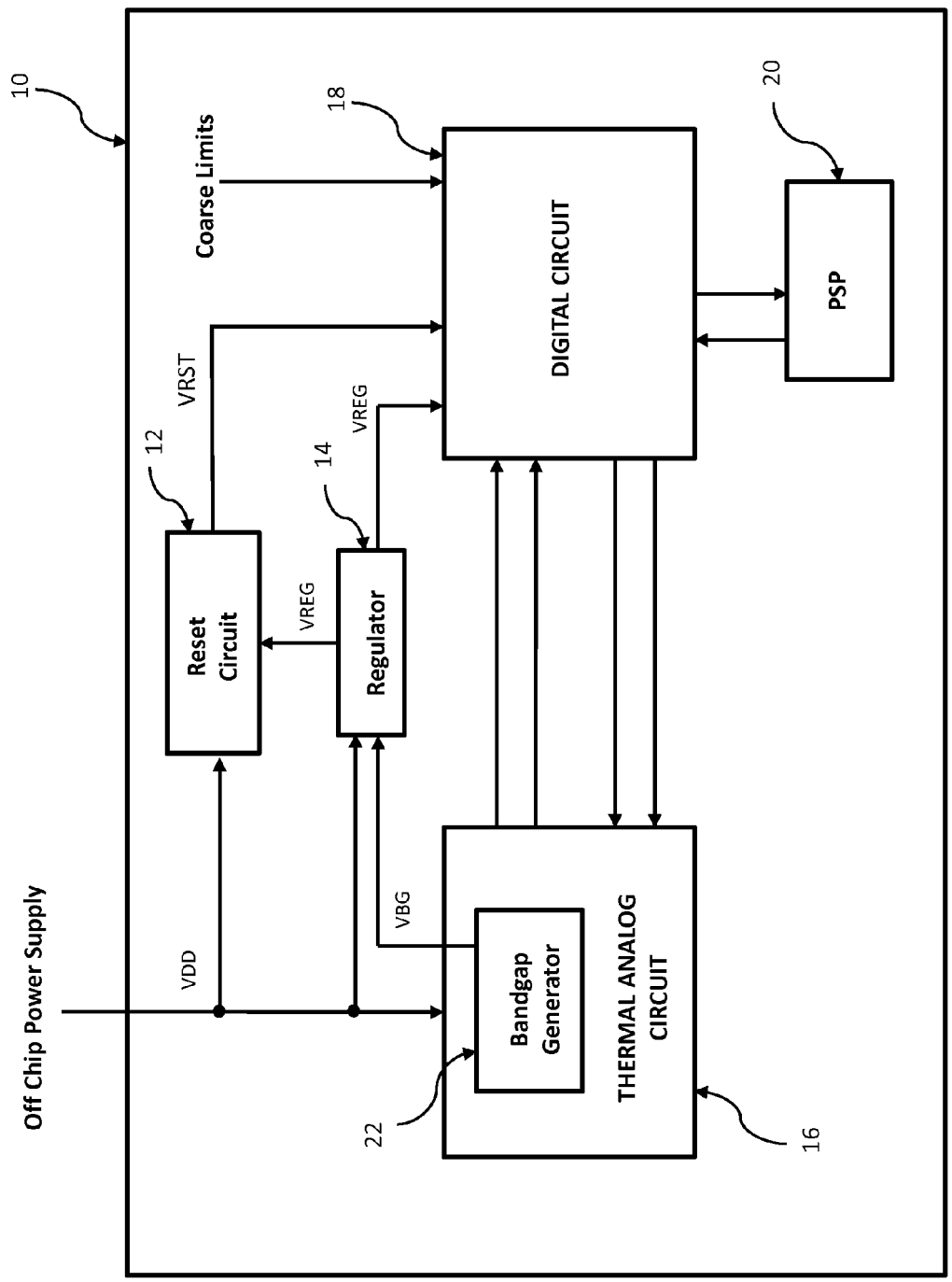
FIG. 1 is a block diagram illustrating one example application of a power-up detection circuit according to the present disclosure.

FIG. 1 is a block diagram illustrating an exemplary processor—SoC 10—configured for detecting and responding to thermal tampering. Other types of integrated circuits and processors could also embody aspects of the invention including digital signal processors (DSPs), graphic processing units (GPUs), central processing units (CPUs), accelerated processing units (APUs), field programmable gate arrays (FPGAs) and the like. However, in the exemplary embodiments described herein the exemplary processor is illustrated and embodied in an SoC, SoC 10. SoC 10 generally includes a reset circuit 12, a voltage regulator 14, a thermal analog circuit 16, a digital circuit 18 and a platform security processor ("PSP") 20. In general, when power is applied to SoC 10 by an off-chip power supply, voltage VDD increases until it reaches an acceptable level. During this time, circuit 12 applies a reset signal ("VRST") to digital circuit 18 to prevent it from attempting to operate. Circuit 12 also monitors VDD and the output of regulator 14 (VREG), which is also applied to digital circuit 18, to determine when VREG reaches a level for safe operation of digital circuit 18. When VREG reaches a safe voltage, circuit 12 removes VRST and digital circuit 18 begins operation in the manner, for example, described in detail in co-pending provisional application Ser. No. 61/825,470, entitled METHOD AND APPARATUS FOR MONITORING PERFORMANCE FOR SECURE CHIP OPERATION, filed May 20, 2013 (hereinafter, "the Secure Chip Application"), the entire disclosure of which is expressly incorporated herein by reference.

When SoC 10 completes a power-up or reset sequence (i.e., circuit 12 removes VRST applied to digital circuit 18 and SoC 10 enters a normal operating mode), the various power supply, temperature and timing checks described in the Secure Chip Application are performed. The focus of the present disclosure is to provide embodiments of a power-up detection circuit that ensure that SoC 10, or any other suitable circuit, does not enter a normal operating mode (i.e., remains in reset) upon power-up until certain conditions are met as is further described below. Further, it should be understood that the teachings of the present disclosure have application to other circuits, and in particular digital circuit 18 may be replaced with any suitable electrical monitoring circuit that should be maintained in reset mode until power-up is completed.

Referring back to FIG. 1, thermal analog circuit 16 includes, among other things as described in the Secure Chip Application, a bandgap generator 22. In one embodiment of the present disclosure, a voltage derived from the output of bandgap generator 22 is used as a reference against which to compare other voltages generated during power-up. The output of bandgap generator 22 ("VBG") must reach a certain level before the above-mentioned power supply, temperature and timing check can reliably be performed. If VBG is not at an appropriate operating level, then the various voltages derived from VBG will also deviate proportionally from an appropriate operating level, thereby potentially allowing incorrect power supply levels to pass the power supply security checks described in the Secure Chip Application. As such, in one embodiment of the present disclosure, a power-up detection circuit determines, based on characteristics of the power supply voltage to bandgap generator 22 and characteristics of VBG, when VRST can be safely removed.

Figure 2:
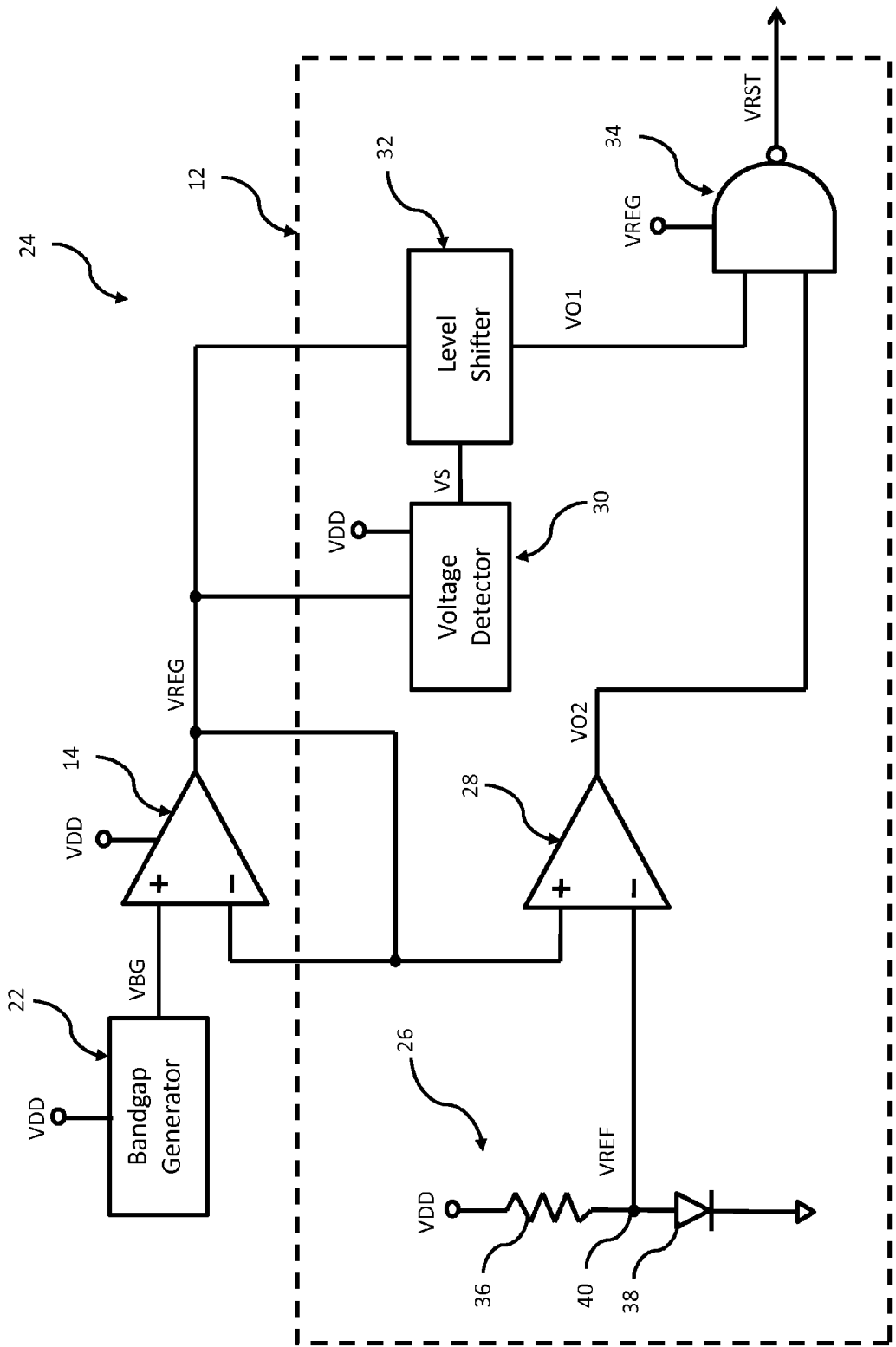
FIG. 2 is a block diagram illustrating one embodiment of a power-up detection circuit.

FIG. 2 depicts one embodiment of a power-up detection circuit 24 according to the present disclosure. Circuit 24 generally includes reset circuit 12, regulator 14, and bandgap generator 22. Reset circuit 12 is connected to regulator 14. As is also shown in FIG. 1, regulator 14 receives VBG from bandgap generator 22 as one input. The output of regulator 14, which is configured as an amplifier in unity gain mode, is VREG. Circuit 12 generally includes a reference circuit 26, a comparator 28, a voltage detector 30, a level shifter 32 and a release circuit, which in this embodiment is a NAND gate 34. Reference circuit 26 includes a resistor 36 connected to the power supply input voltage VDD, and a diode 38 connected between resistor 36 and ground. The node 40 connecting resistor 36 and diode 38 is reference voltage VREF, which is connected to the negative input of comparator 28. The output of regulator 14 (i.e., VREG) is provided to the positive input of comparator 28, as well as to voltage detector 30, level shifter 32 and gate 34. The output of voltage detector 30, VS, is provided to level shifter 32. Level shifter 32 in turn provides VO1 as one input to gate 34. The other input to gate 34 is the output of comparator 28, VO2. The output of gate 34 is VRST, which in the application shown in FIG. 1 is the reset signal supplied to digital circuit 18.

Figure 3:
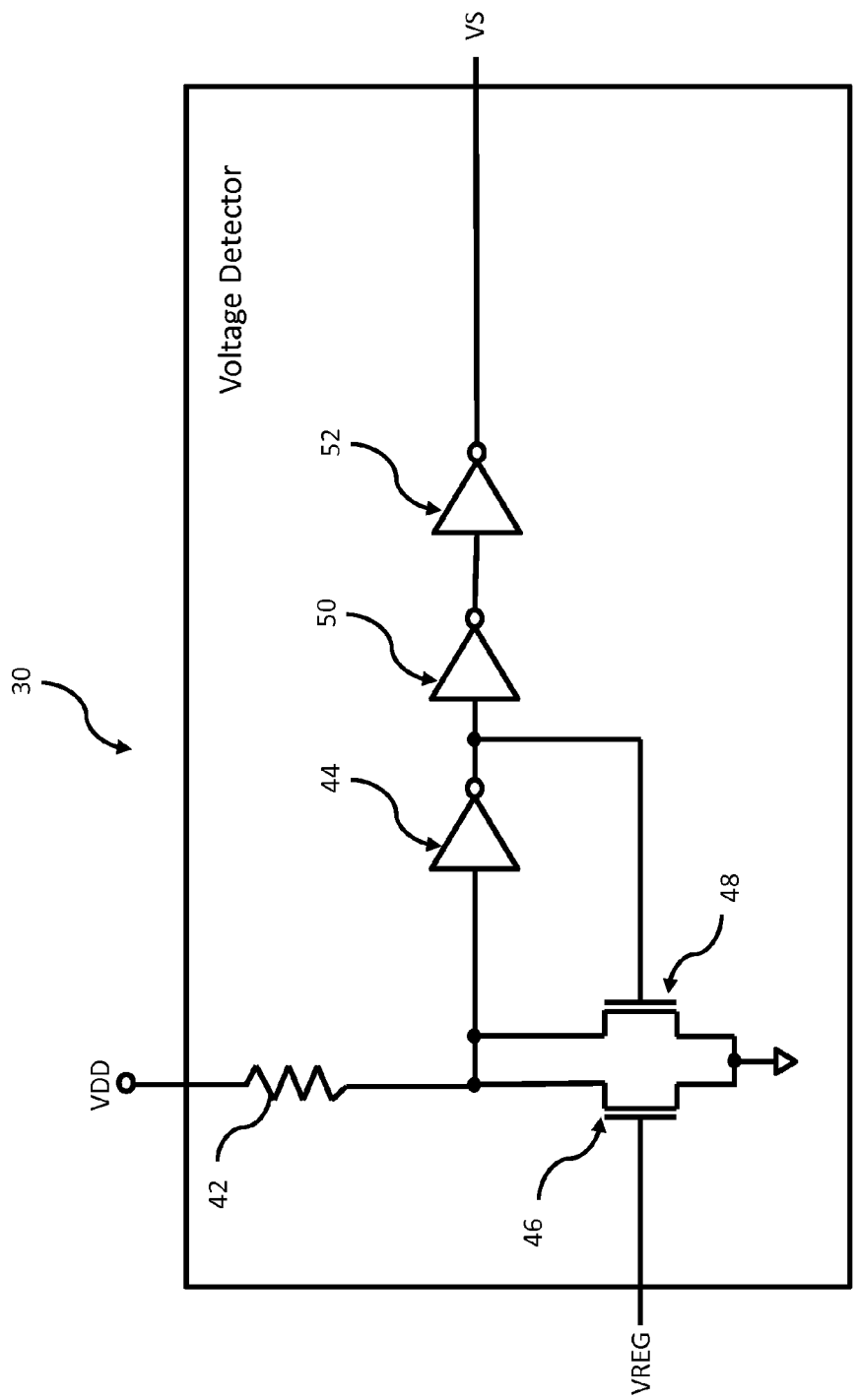
FIG. 3 is a block diagram illustrating further details of the voltage detector depicted in FIG. 2.

Turning now to FIG. 3, voltage detector 30 is shown in more detail. Specifically, voltage detector 30 is shown with input voltages VDD and VREG, and providing output voltage VS. Voltage detector 30 includes an input resistor 42 coupled to VDD at one end and to inverter 44 and the source inputs of transistors 46, 48 at the other end. The gate of transistor 46 is connected to VREG. The output of inverter 44 is coupled to inverter 50 and the gate of transistor 48. The drain nodes of transistors 46, 48 are coupled to ground. The output of inverter 50 is connected to inverter 52, which provides output voltage VS to level shifter 32 (FIG. 2).

The operation of power-up detection circuit 24 of FIG. 2 is explained with reference to the timing diagram of FIG. 4. At the top of FIG. 4, VDD is shown ramping up from zero volts to its normal operating voltage (e.g., 1.8 volts). As VDD is applied to bandgap generator 22 and regulator 14, eventually the output of regulator 14 (i.e., VREG) begins to increase from zero volts to its normal operating voltage (e.g., 1.0 volts). When VREG reaches a known safe voltage, which in this embodiment of circuit 24 is the threshold of transistor 46 of voltage detector 30, the output of level shifter 32 (i.e., VO1) transitions to logic 1. This transition and its correlation with VREG is indicated at line 54 of FIG. 4. More specifically with reference to FIG. 3, when VREG is below the threshold voltage of transistor 46, the output of voltage detector 30 (i.e., VS) is zero. Accordingly, the output of level shifter 32 is also zero. When VREG exceeds the threshold voltage of transistor 46 (as a result of VDD ramping up to an acceptable voltage), transistor 46 turns on, causing the input of inverter 44 to transition to logic 0. The output of inverter 44 is thus logic 1, which activates transistor 48, and is inverted by inverter 50 to logic 0. Finally, the output of inverter 50 is logic 1, which is shifted by level shifter 32 to the VREG domain in a manner known by those skilled in the art. Consequently, the output of level shifter 32 transitions to logic 1 as depicted by VO1 in FIG. 4. The logic 1 output VO1 is provided as one input to gate 34 (FIG. 2) and constitutes satisfaction of one condition necessary for removal of VRST from digital circuit 18 of FIG. 1.

Figure 4:
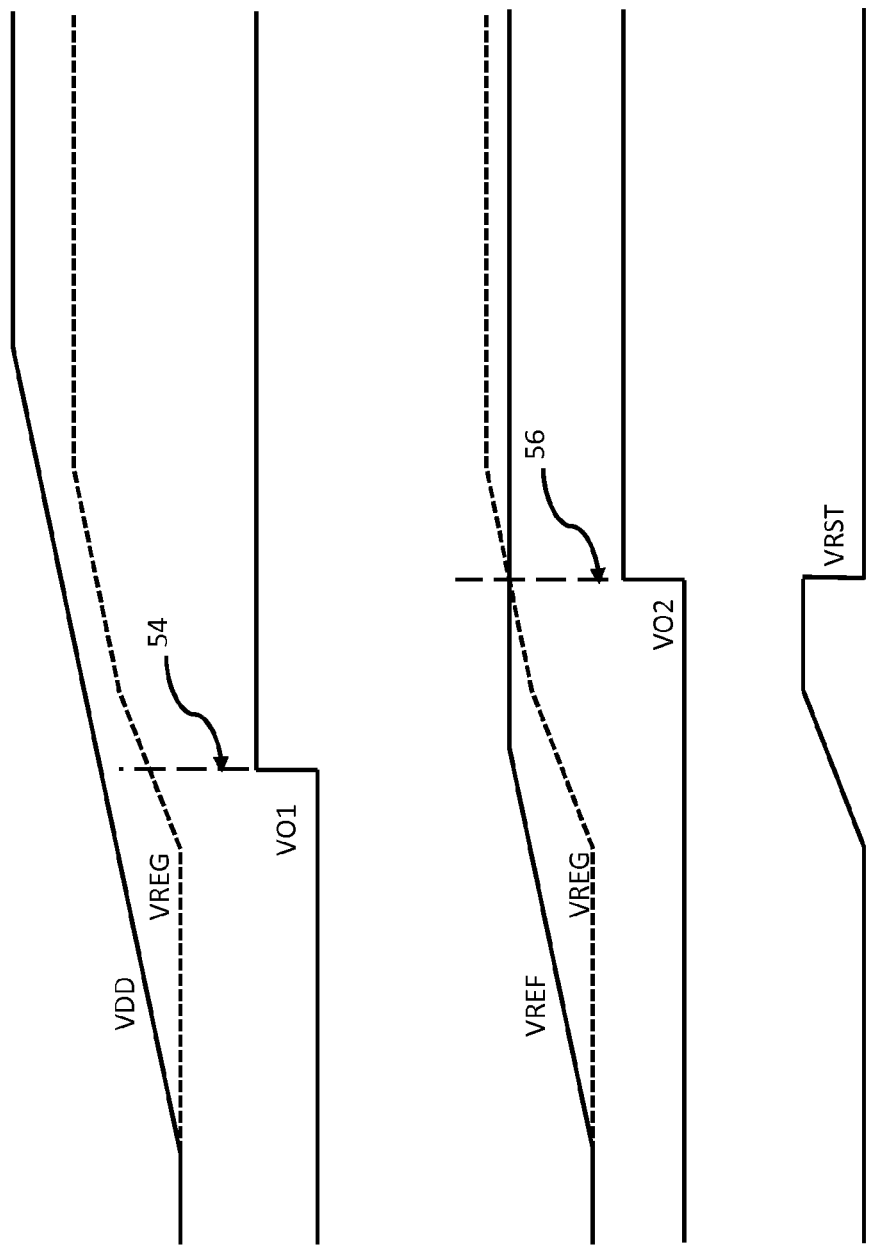
FIG. 4 is a timing diagram illustrating power-up characteristics of various signals generated by the circuit of FIG. 2.

Still referring to FIG. 4, the center grouping of signals depicts satisfaction of the second condition necessary for removal of VRST. Specifically, VREF is shown transitioning from zero volts to a voltage corresponding to the drop across diode 38 of FIG. 2. As VDD increases, VREF also increases until the diode drop voltage is reached. VREG shown in the center grouping of FIG. 4 is the same as shown in the upper grouping. When VREG exceeds the diode drop voltage of VREF, the output of comparator 28 (i.e., VO2) transitions to logic 1. This transition and its correlation with VREG is indicated at line 56 of FIG. 4. When VO2 transitions to logic 1, both inputs to gate 34 are logic 1, and the output (shown as VRST in FIG. 4) transitions from its default logic 1 state, which maintains digital circuit 18 in reset, to logic 0, thereby releasing digital circuit 18 from the reset mode.

Figure 5:
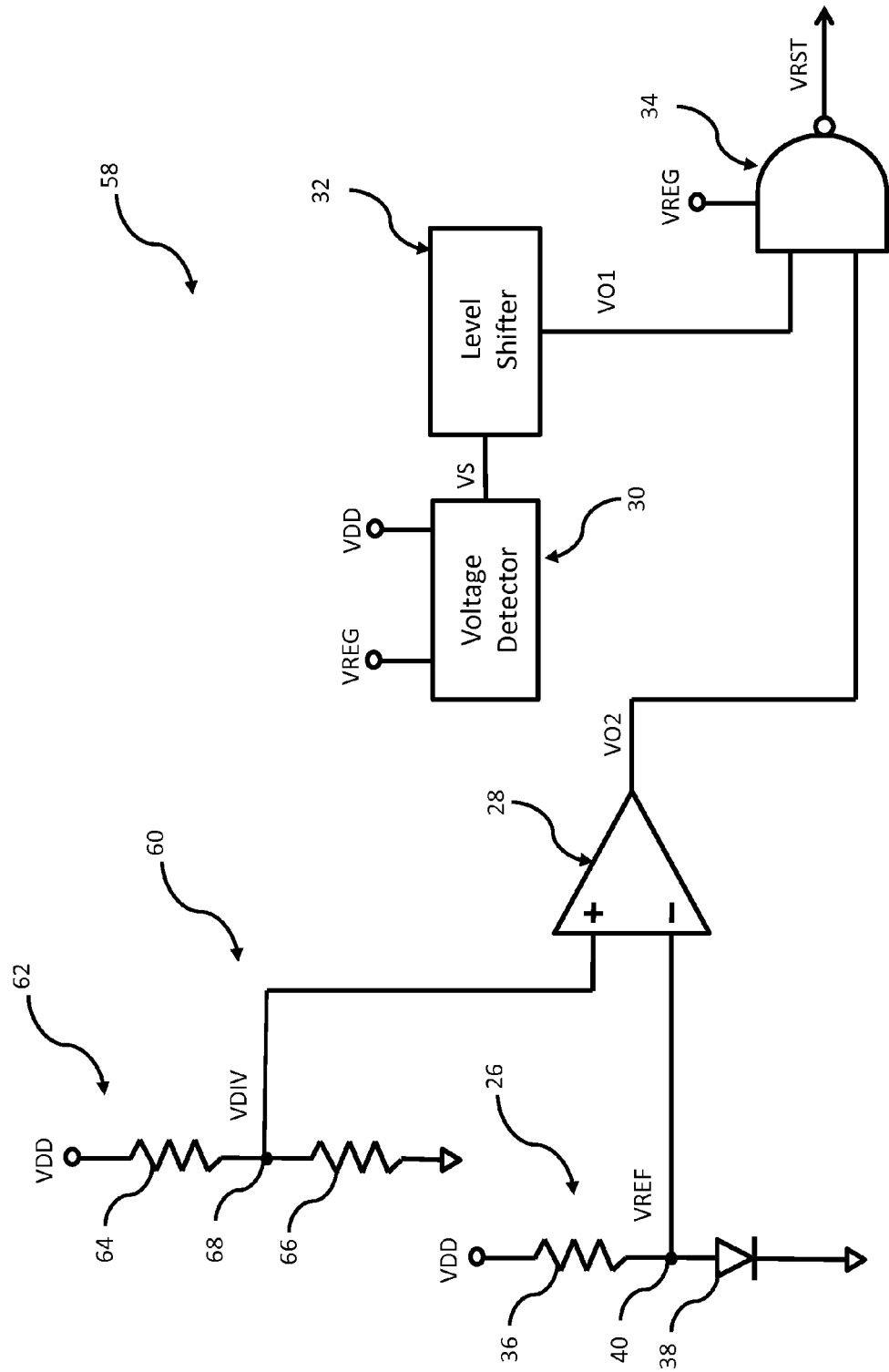
FIG. 5 a block diagram illustrating another embodiment of a power-up detection circuit.

FIG. 5 depicts another embodiment of a power-up detection circuit 58 according to the present disclosure. In this embodiment, the output of bandgap generator 22 and regulator 14 are not directly monitored. Instead, VDD is used to infer that the other voltages are at safe levels to exit reset mode. Circuit 58 generally includes a reference circuit 60, comparator 28, voltage detector 30, level shifter 32 and NAND gate 34. Reference circuit 60 includes a voltage divider 62 and reference circuit 26 of FIG. 2. Voltage divider 62 includes resistor 64 coupled to VDD and resistor 66 coupled to ground. The output node 68 of voltage divider 62 provides a voltage ("VDIV") to the positive input of comparator 28.

The operation of power-up detection circuit 58 of FIG. 5 is explained with reference to the timing diagram of FIG. 6. In the grouping of signals at the top of FIG. 6, VDD is shown ramping up, thereby causing VREG to increase until VREG exceeds the threshold of transistor 46 in the manner described above with reference to FIG. 4. As previously described, when VREG exceeds the threshold (satisfying the first condition for releasing VRST), the output of level shifter 32 (i.e., VO1) transitions to logic 1 as indicated by line 54 of FIG. 6.

Figure 6:
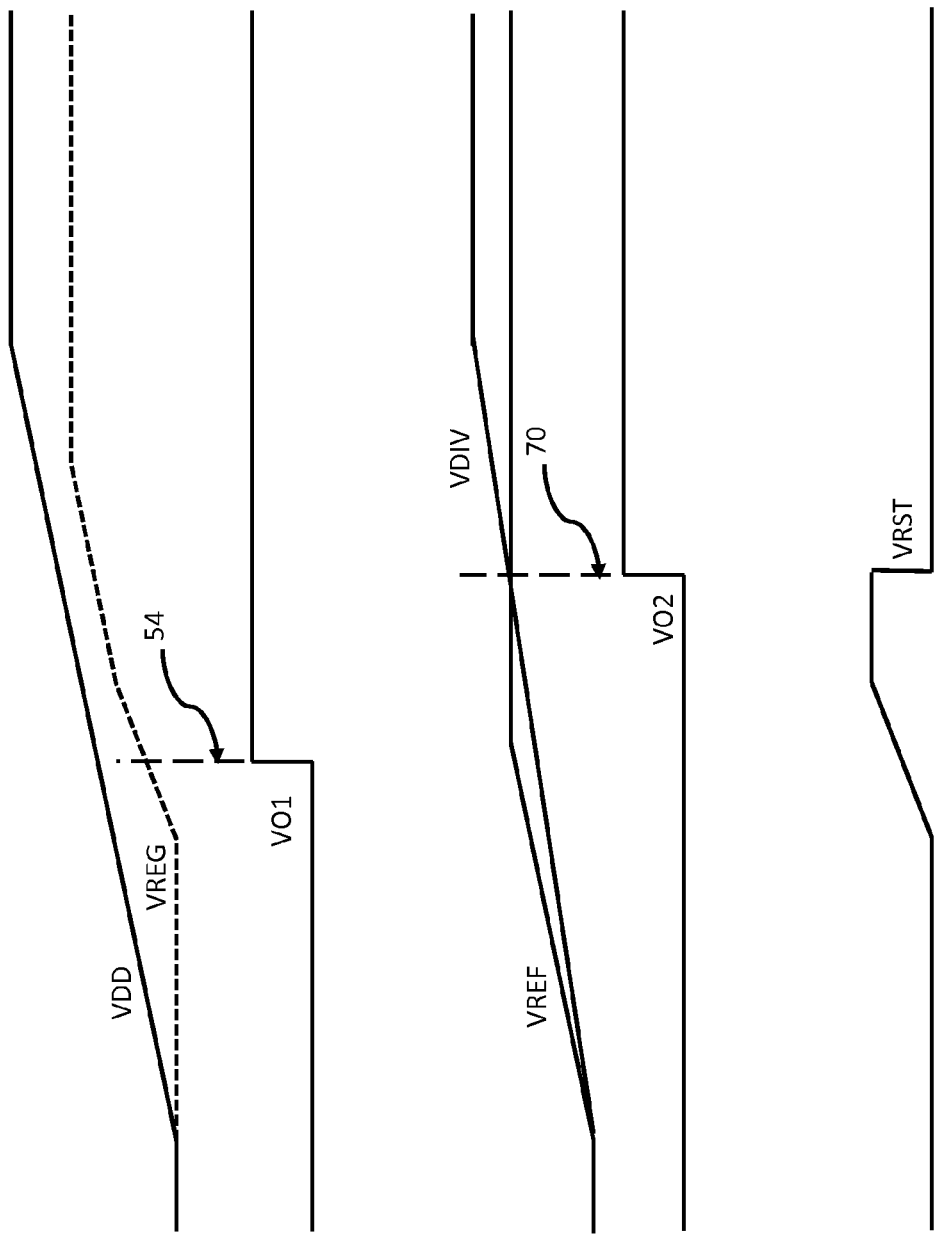
FIG. 6 is a timing diagram illustrating power-up characteristics of various signals generated by the circuit of FIG. 5.

The center grouping of signals of FIG. 6 depicts VREF at node 40 of FIG. 5 increasing with VDD until VREF reaches the voltage drop across diode 38. Also shown is VDIV, which is simply a scaled version of VDD as divided by voltage divider 62. Thus, VDIV increases directly as VDD increases. As VREF and VDIV are inputs to comparator 28, when VDIV exceeds VREF (i.e., exceeds the voltage drop across diode 38), the second condition for releasing VRST is satisfied, and the output of comparator 28 (i.e., VO2) transitions to logic 1 as indicated by line 70 of FIG. 6. When this occurs, both inputs VO1 and VO2 to gate 34 are in a logic 1 state, thereby causing output VRST to transition from its default logic 1 to logic 0 and release digital circuit 18 from reset mode.

Figure 7:
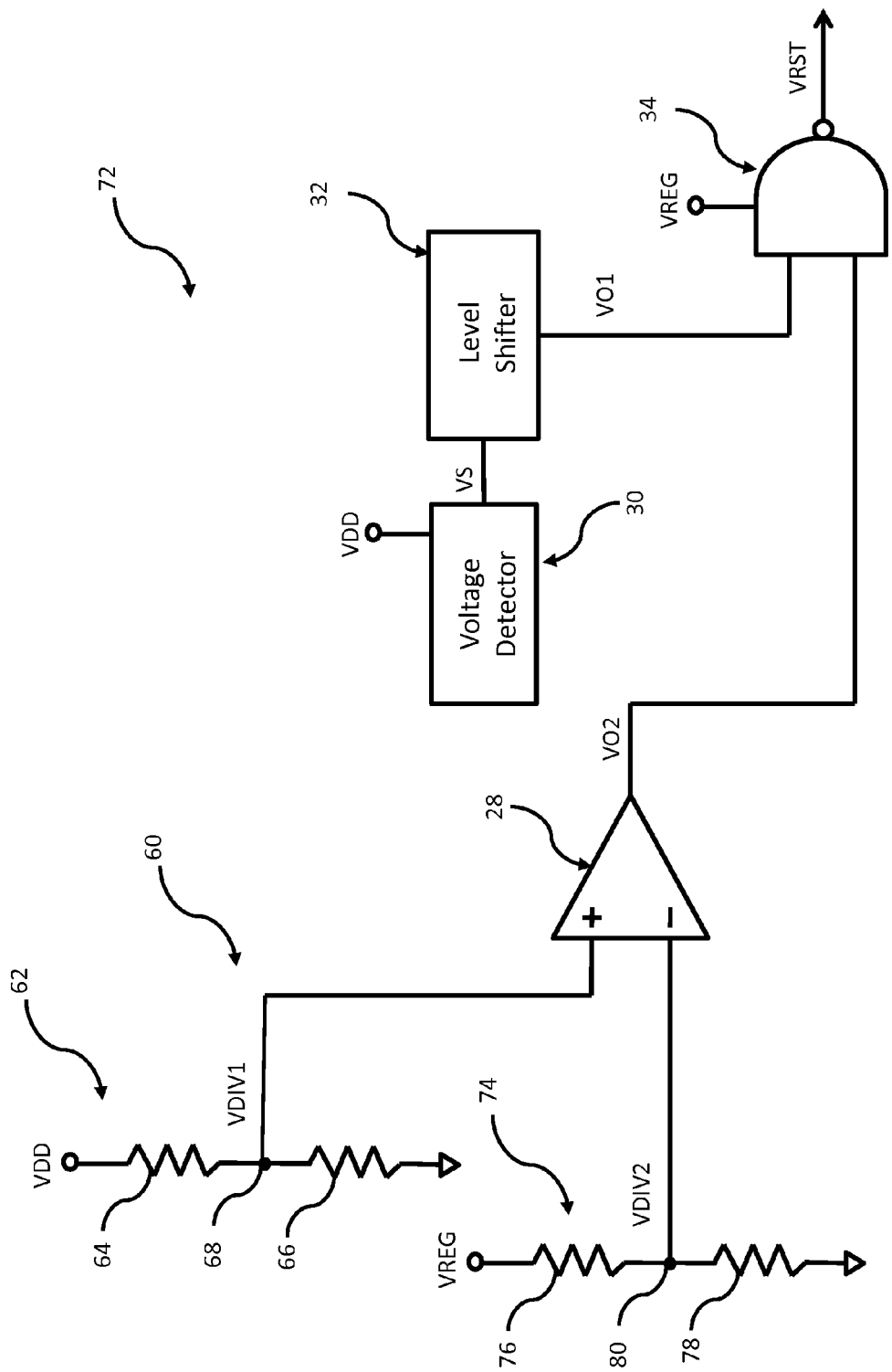
FIG. 7 is a block diagram illustrating another embodiment of a power-up detection circuit.

Yet another embodiment of a power-up detection circuit is depicted in FIG. 7. Circuit 72 is the same as circuit 58 except that a second voltage divider 74 replaces reference circuit 26 and is connected to VREG. Voltage divider 74 includes resistor 76 coupled to VREG and resistor 78 coupled to ground. The output node 80 provides the negative input (i.e., "VDIV2") to comparator 28, and, as was explained with reference to FIG. 5, the output of voltage divider 62 (i.e., "VDIV1") provides the positive input to comparator 28.

The operation of power-up detection circuit 72 of FIG. 7 is explained with reference to the timing diagram of FIG. 8. In the grouping of signals at the top of FIG. 8, VDD is shown ramping up, thereby causing VREG to increase until VREG exceeds the threshold of transistor 46 in the manner described above with reference to FIG. 4. As previously described, when VREG exceeds the threshold (satisfying the first condition for releasing VRST), the output of level shifter 32 (i.e., VO1) transitions to logic 1 as indicated by line 54 of FIG. 8.

Figure 8:
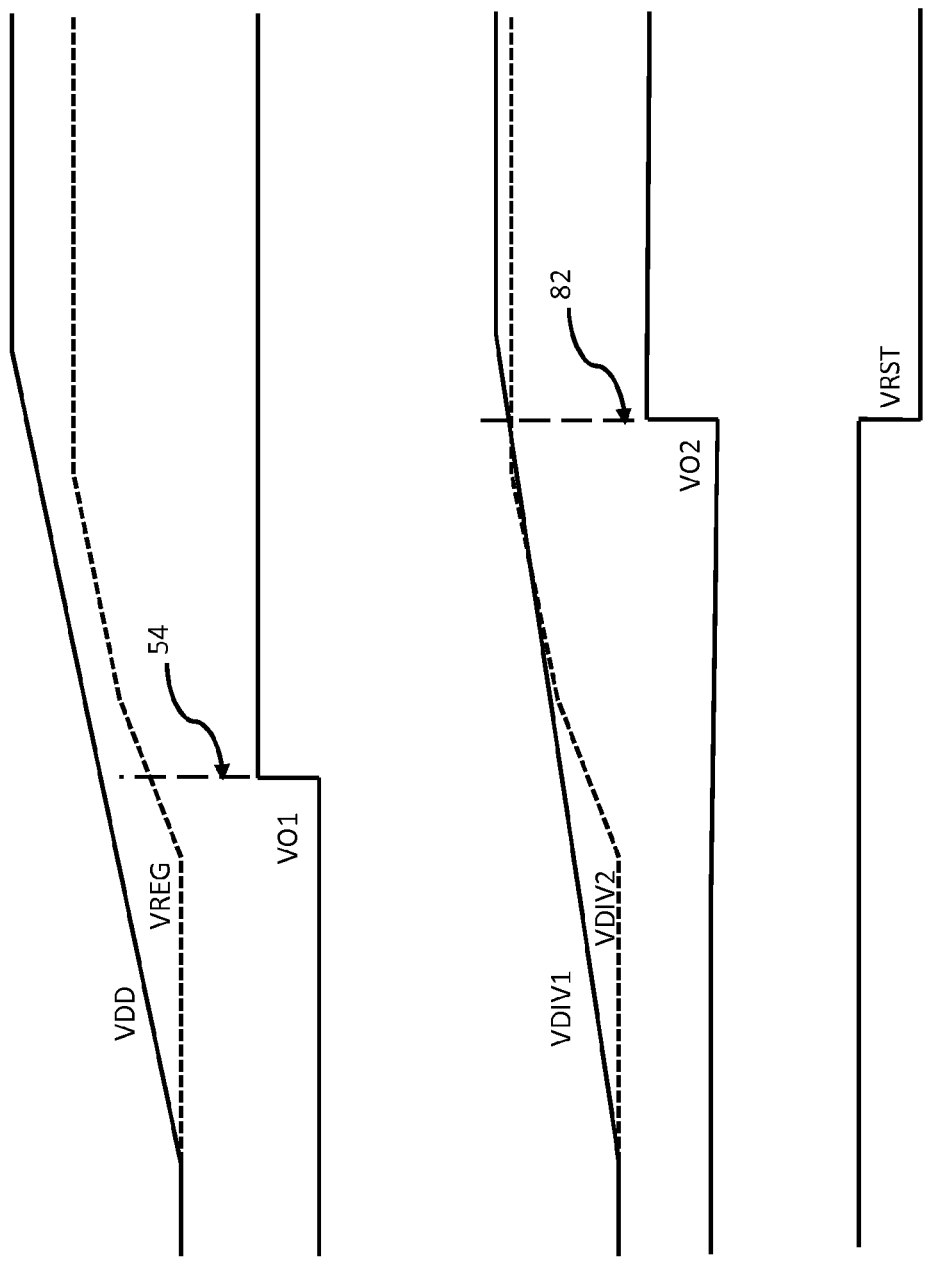
FIG. 8 is a timing diagram illustrating power-up characteristics of various signals generated by the circuit of FIG. 7.

The center grouping of signals of FIG. 8 depicts VDIV2 (the divided version of VREG) at node 80 of FIG. 7 increasing with VREG until VDIV2 reaches a steady-state voltage corresponding to regulator 14 and bandgap generator 22 reaching their normal operating voltages. Also shown is VDIV1, which is simply a scaled version of VDD as divided by voltage divider 62. Thus, VDIV1 increases directly as VDD increases. As VDIV2 and VDIV1 are inputs to comparator 28, when VDIV1 exceeds VDIV2, the second condition for releasing VRST is satisfied, and the output of comparator 28 (i.e., VO2) transitions to logic 1 as indicated by line 82 of FIG. 8. When this occurs, both inputs VO1 and VO2 to gate 34 are in a logic 1 state, thereby causing output VRST to transition from its default logic 1 to logic 0 and release digital circuit 18 from reset mode.

Figure 9:
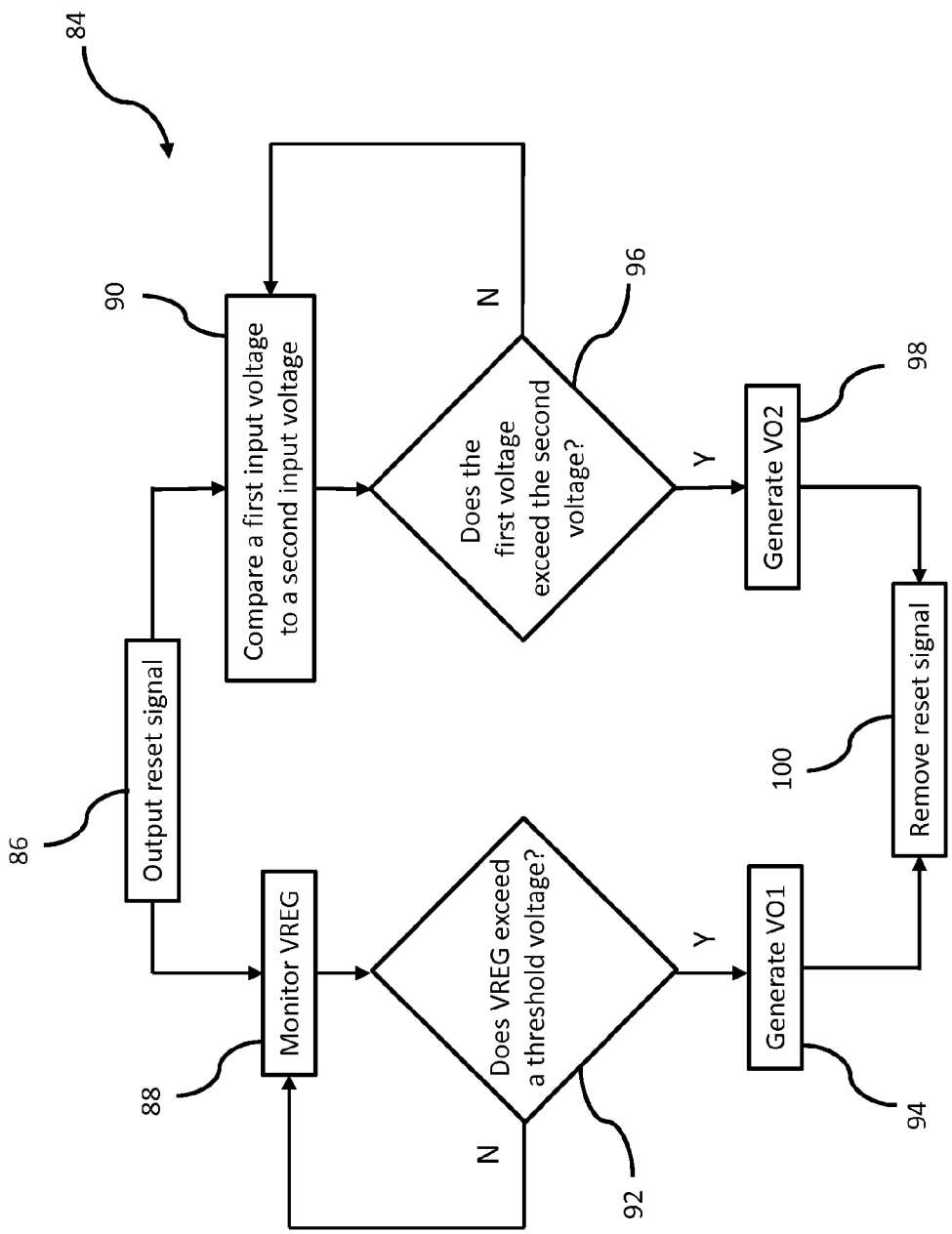
FIG. 9 is a flow diagram illustrating a method according to one embodiment of the present disclosure.

Referring now to FIG. 9, a method 84 is depicted that corresponds generally to the operation of each of circuits 24, 58 and 72 of FIGS. 2, 5 and 7, respectively. As shown, method 84 begins at step 86 wherein the circuit defaults to providing VRST during power-up. At step 88, VREG is monitored and at step 90 a first input voltage is compared to a second input voltage. At step 92, it is determined whether VREG exceeds a threshold voltage. If not, then the method continues monitoring VREG at step 88. If VREG exceeds the threshold voltage at step 92, then VO1 is generated at step 94. This corresponds to satisfaction of the first condition (i.e., that VREG exceed the threshold voltage of transistor 46).

At step 96 it is determined whether the first voltage exceeds the second voltage. If not, then the method continues to compare the first voltage to the second voltage at step 90. If the first voltage exceeds the second voltage at step 96, then VO2 is generated at step 98. This corresponds to satisfaction of the second condition, which involves comparisons of various voltages as explained with reference to the embodiments of FIGS. 2, 5 and 7. If both VO1 and VO2 are generated, then at step 100 the reset signal is removed (i.e., transitioned to logic 0 in the embodiments described above).

Figure 10:
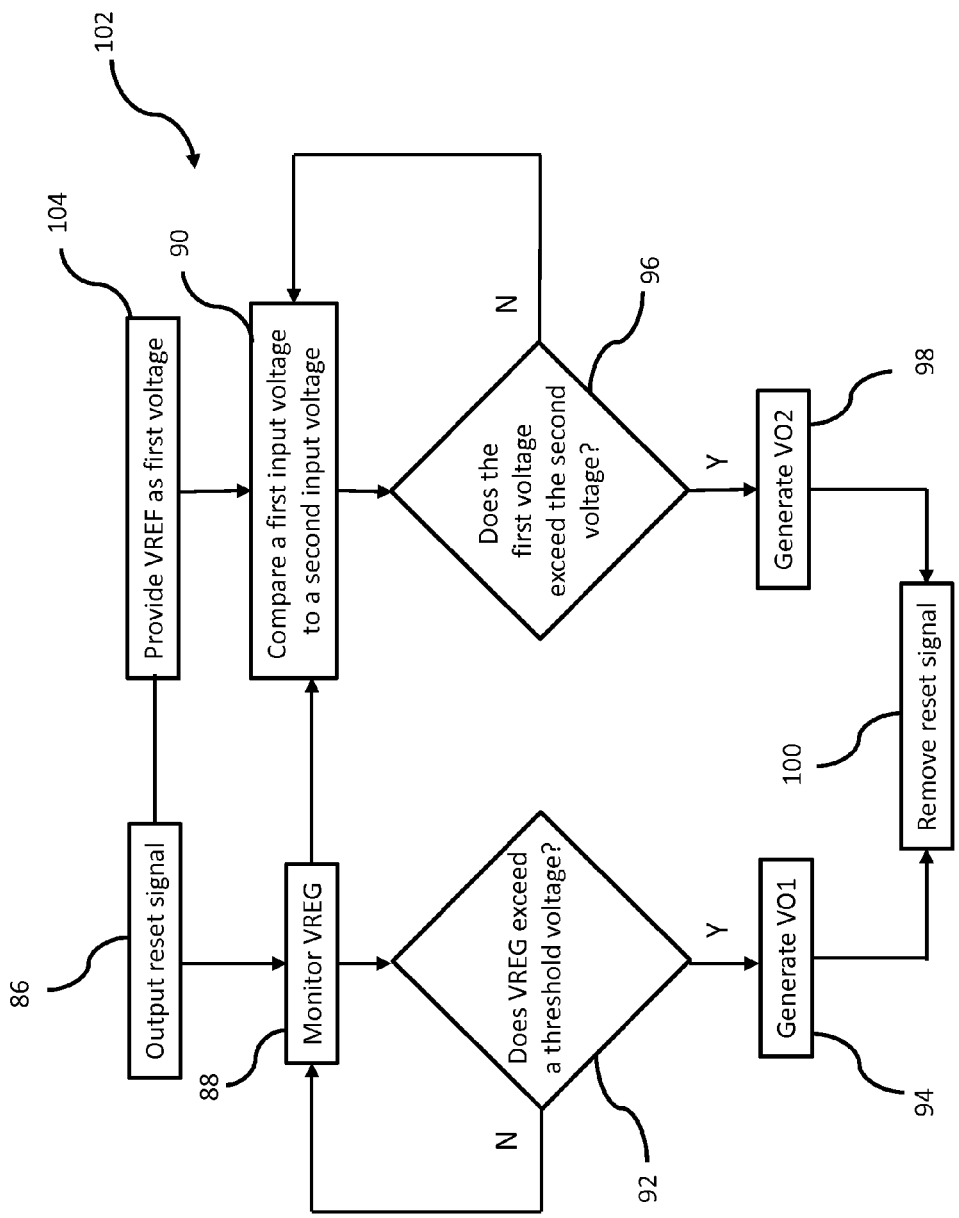
FIG. 10 is a flow diagram illustrating a variant of the method of FIG. 9.

FIG. 10 depicts a method according to the present disclosure corresponding to the embodiment of FIG. 2. The method depicted in FIG. 10 is identical to that of FIG. 9 except that the monitored voltage VREG is supplied to step 90 as the second voltage for comparison. Additionally, VREF is provided at step 104 as the first voltage for comparison at step 90. The remainder of the method is the same as that described above with reference to FIG. 9.

Figure 11:
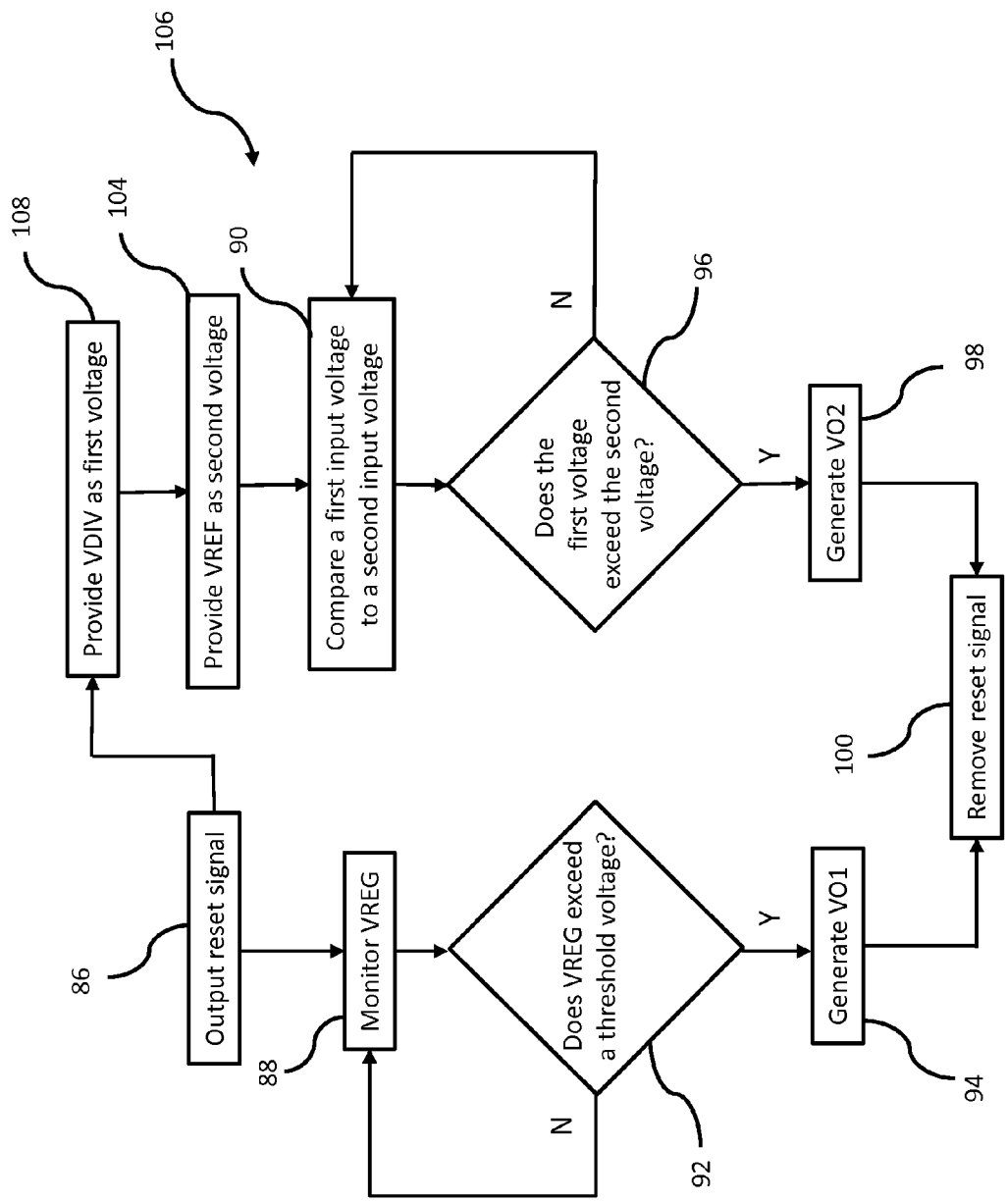
FIG. 11 is a flow diagram illustrating another variant of the method of FIG. 9.

FIG. 11 depicts a method according to the present disclosure corresponding to the embodiment of FIG. 5. The method 106 depicted in FIG. 11 is identical to that of FIG. 9 except that the voltage VDIV is supplied at step 108 as the first voltage for comparison and the voltage VREF is supplied at step 104 as the second voltage for comparison at step 90. The remainder of the method is the same as that described above with reference to FIG. 9.

Figure 12:
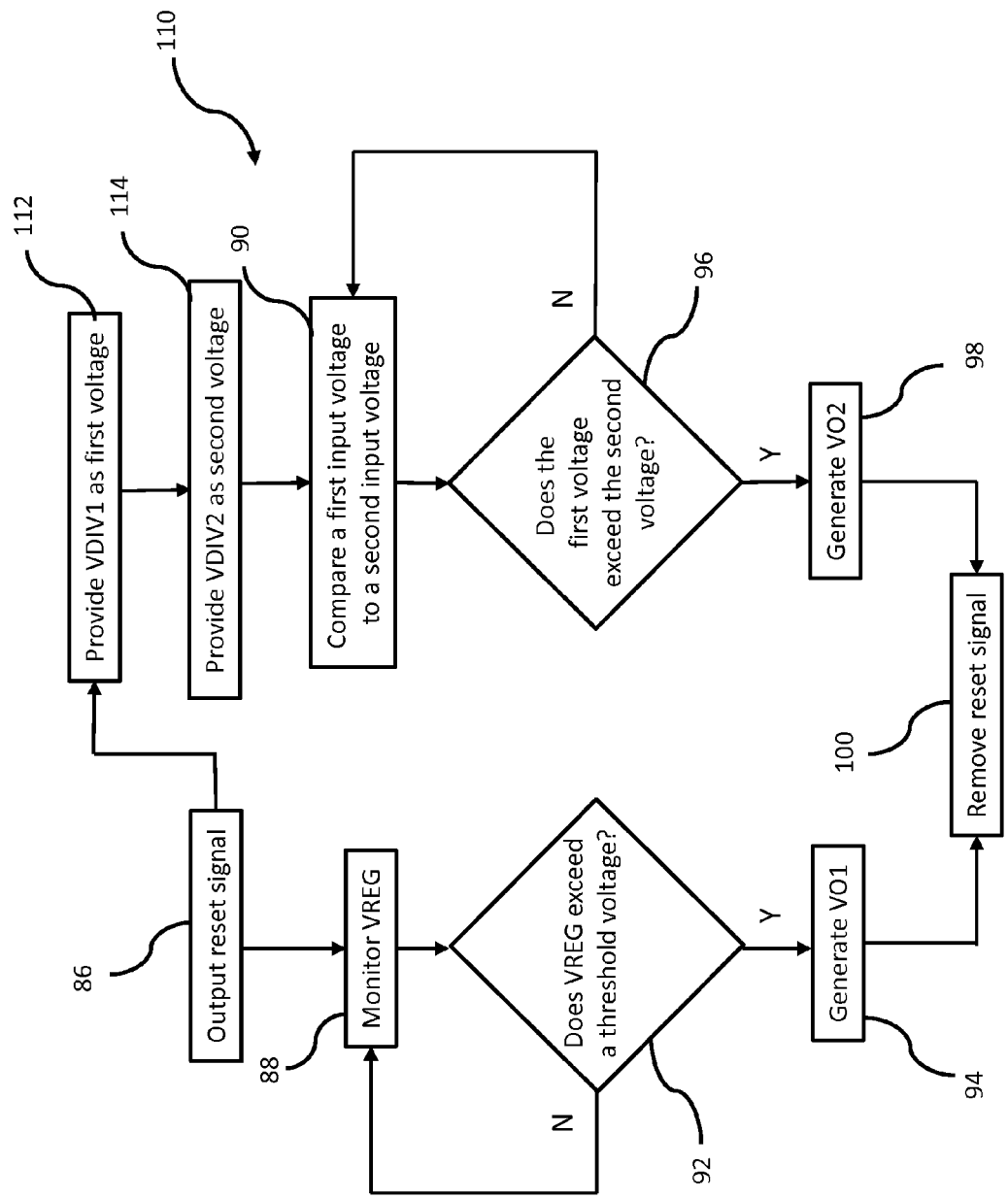
FIG. 12 is a flow diagram illustrating another variant of the method of FIG. 9.

FIG. 12 depicts another method according to the present disclosure corresponding to the embodiment of FIG. 7. The method 110 depicted in FIG. 12 is identical to that of FIG. 9 except that the voltage VDIV1 is supplied at step 112 as the first voltage for comparison and the voltage VDIV2 is supplied at step 114 as the second voltage for comparison at step 90. The remainder of the method is the same as that described above with reference to FIG. 9.

Among other advantages, for example, the method and apparatus provides the ability to detect and deter attempts to hack into the copyrighted and proprietary information in the SoC during power-up. Other advantages will be apparent to those skilled in the art.

The above detailed description of the invention and the examples described therein have been presented for the purposes of illustration and description only and not by limitation. It is therefore contemplated that the present invention cover any and all modifications, variations or equivalents that fall within the spirit and scope of the basic underlying principles disclosed above and claimed herein.

What is claimed is:

1. An apparatus for outputting a reset signal during power-up until two conditions are satisfied, comprising:
   a voltage detector that provides a first output ("VO1") when an output voltage of a regulator ("VREG") exceeds a threshold voltage, thereby satisfying a first condition, the voltage detector comprising a transistor having a gate connected to VREG and a source connected through an input resistor to a supply voltage, a voltage at the gate of the transistor being the threshold voltage;
   a comparator receiving a first input voltage and a second input voltage, the comparator providing a second output ("VO2") when the first input voltage exceeds the second input voltage, thereby satisfying a second condition; and
   a release circuit that outputs the reset signal unless the voltage detector provides VO1 while the comparator provides VO2.

2. The apparatus of claim 1, further comprising a reference circuit that provides a reference voltage ("VREF") as the second input voltage to the comparator, VREF corresponding to a voltage drop of a supply voltage across a diode.

3. The apparatus of claim 2, wherein VREG is the first input voltage to the comparator.

4. The apparatus of claim 1, further comprising a reference circuit that provides a first voltage ("VDIV") as the first input voltage to the comparator and a second voltage ("VREF") as the second input voltage to the comparator, VDIV corresponding to an output voltage of a voltage divider having a supply voltage as an input and VREF corresponding to a voltage drop of the supply voltage across a diode.

5. The apparatus of claim 1, further comprising a reference circuit that provides a first voltage ("VDIV1") as the first input voltage to the comparator and a second voltage ("VDIV2") as the second input voltage to the comparator, VDIV1 corresponding to an output voltage of a first voltage divider having a supply voltage as an input and VDIV2 corresponding to an output voltage of a second voltage divider having VREG as an input.

6. The apparatus of claim 1, wherein the regulator provides VREG as a function of a bandgap generator output ("VBG").

7. The apparatus of claim 1, wherein the release circuit is a NAND gate having VO1 as one input and VO2 as another input.

8. A method of determining whether to output a reset signal during power-up to prevent operation of a digital monitoring circuit until two conditions are satisfied, comprising:
generating by a voltage detector a first output ("VO1") when an output voltage of a regulator ("VREG") exceeds a threshold voltage, thereby satisfying a first condition, the voltage detector comprising a transistor having a gate connected to VREG and a source connected through an input resistor to a supply voltage, a voltage at the gate of the transistor being the threshold voltage;
comparing a first input voltage and a second input voltage;
generating a second output ("VO2") when the first input voltage exceeds the second input voltage, thereby satisfying a second condition;
outputting the reset signal in the absence of one or both of VO1 and VO2; and
not outputting the reset signal when both VO1 and VO2 are generated.

9. The method of claim 8, further comprising:
providing a reference voltage ("VREF") as the second input voltage, VREF corresponding to a voltage drop of a supply voltage across a diode.

10. The method of claim 9, wherein VREG is the first input voltage.

11. The method of claim 8, further comprising:
providing a first voltage ("VDIV") as the first input voltage; and
providing a second voltage ("VREF") as the second input voltage;
wherein VDIV corresponds to an output voltage of a voltage divider having a supply voltage as an input and VREF corresponds to a voltage drop of the supply voltage across a diode.

12. The method of claim 8, further comprising:
providing a first voltage ("VDIV1") as the first input voltage; and
providing a second voltage ("VDIV2") as the second input voltage;
wherein VDIV1 corresponds to an output voltage of a first voltage divider having a supply voltage as an input and VDIV2 corresponds to an output voltage of a second voltage divider having VREG as an input.

13. The method of claim 8, further comprising:
generating a VREG as a function of a bandgap generator output ("VBG").

14. The method of claim 8, wherein the threshold voltage is a transistor threshold voltage.

15. An apparatus for monitoring performance of a processor to detect tampering and place the processor in a safe operating state that prevents unauthorized access to contents of the processor, comprising:
a voltage detector that provides a first output ("VO1") when an output voltage of a regulator ("VREG") exceeds a threshold voltage, the voltage detector comprising a transistor having a gate connected to VREG and a source connected through an input resistor to a supply voltage, a voltage at the gate of the transistor being the threshold voltage;
a comparator receiving a first input voltage and a second input voltage, the comparator providing a second output ("VO2") when the first input voltage exceeds the second input voltage;
a release circuit that outputs the reset signal unless the voltage detector provides VO1 while the comparator provides VO2; and
a monitoring circuit connected to the release circuit, the monitoring circuit remaining in a reset mode during power-up until the release circuit stops outputting the reset signal, whereupon the monitoring circuit compares a first measured value of an operating parameter of the processor to a predefined set of high and low limits to identify an out of limits measured value.

16. The apparatus of claim 15, further comprising a reference circuit that provides a reference voltage ("VREF") as the second input voltage to the comparator, VREF corresponding to a voltage drop of a supply voltage across a diode.

17. The apparatus of claim 16, wherein VREG is the first input voltage to the comparator.

18. The apparatus of claim 15, further comprising a reference circuit that provides a first voltage ("VDIV") as the first input voltage to the comparator and a second voltage ("VREF") as the second input voltage to the comparator, VDIV corresponding to an output voltage of a voltage divider having a supply voltage as an input and VREF corresponding to a voltage drop of the supply voltage across a diode.

19. The apparatus of claim 15, further comprising a reference circuit that provides a first voltage ("VDIV1") as the first input voltage to the comparator and a second voltage ("VDIV2") as the second input voltage to the comparator, VDIV1 corresponding to an output voltage of a first voltage divider having a supply voltage as an input and VDIV2 corresponding to an output voltage of a second voltage divider having VREG as an input.

* * * * *